(12) United States Patent
Makita et al.

(10) Patent No.: US 7,139,298 B2
(45) Date of Patent: Nov. 21, 2006

(54) SEMICONDUCTOR LASER DEVICE AND METHOD OF MANUFACTURING THE SAME

(75) Inventors: Kouji Makita, Akou (JP); Kenji Yoshikawa, Bizen (JP); Takayuki Kashima, Bizen (JP); Hideto Adachi, Okayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 107 days.

(21) Appl. No.: 10/994,436

(22) Filed: Nov. 23, 2004

(65) Prior Publication Data

US 2005/0117619 A1    Jun. 2, 2005

(30) Foreign Application Priority Data

Nov. 25, 2003   (JP)   ............................. 2003-394381

(51) Int. Cl.
*H01S 5/00*   (2006.01)
(52) U.S. Cl. .................................. 372/46.01
(58) Field of Classification Search ............. 372/46.01, 372/44.01, 45.01
See application file for complete search history.

(56) References Cited

U.S. PATENT DOCUMENTS 5,974,068 A * 10/1999 Adachi et al. ........... 372/46.01
6,399,407 B1 * 6/2002 O'Brien et al. ............... 438/29
2002/0064196 A1 * 5/2002 Shiozawa et al. ............ 372/45
2003/0026307 A1 * 2/2003 Makita et al. ................ 372/43

FOREIGN PATENT DOCUMENTS

| JP | 08-222801 | 8/1996 |
| JP | 2003-46197 | 2/2003 |
| JP | 2003-188474 | 7/2003 |

* cited by examiner

*Primary Examiner*—James Menefee
(74) *Attorney, Agent, or Firm*—Wenderoth, Lind & Ponack, L.L.P.

(57) ABSTRACT

The present invention aims to provide a semiconductor laser device which has a structure that is easy to manufacture, a satisfactory temperature characteristic as well as high-speed response characteristic. The device includes the following: an n-type GaAs substrate 101; an n-type AlGaInP cladding layer 102 formed on the n-type GaAs substrate 101; a non-doped quantum well active layer 103; a p-type AlGaInP first cladding layer 104; a p-type GaInP etching stop layer 105; a p-type AlGaInP second cladding layer 106; a p-type GaInP cap layer 107; a p-type GaAs contact layer 108; and an n-type AlInP block layer 109. The device has a ridge portion and convex portions formed on both sides of the ridge portion, and the p-type GaAs contact layer 108 is formed on the ridge portion only.

10 Claims, 11 Drawing Sheets

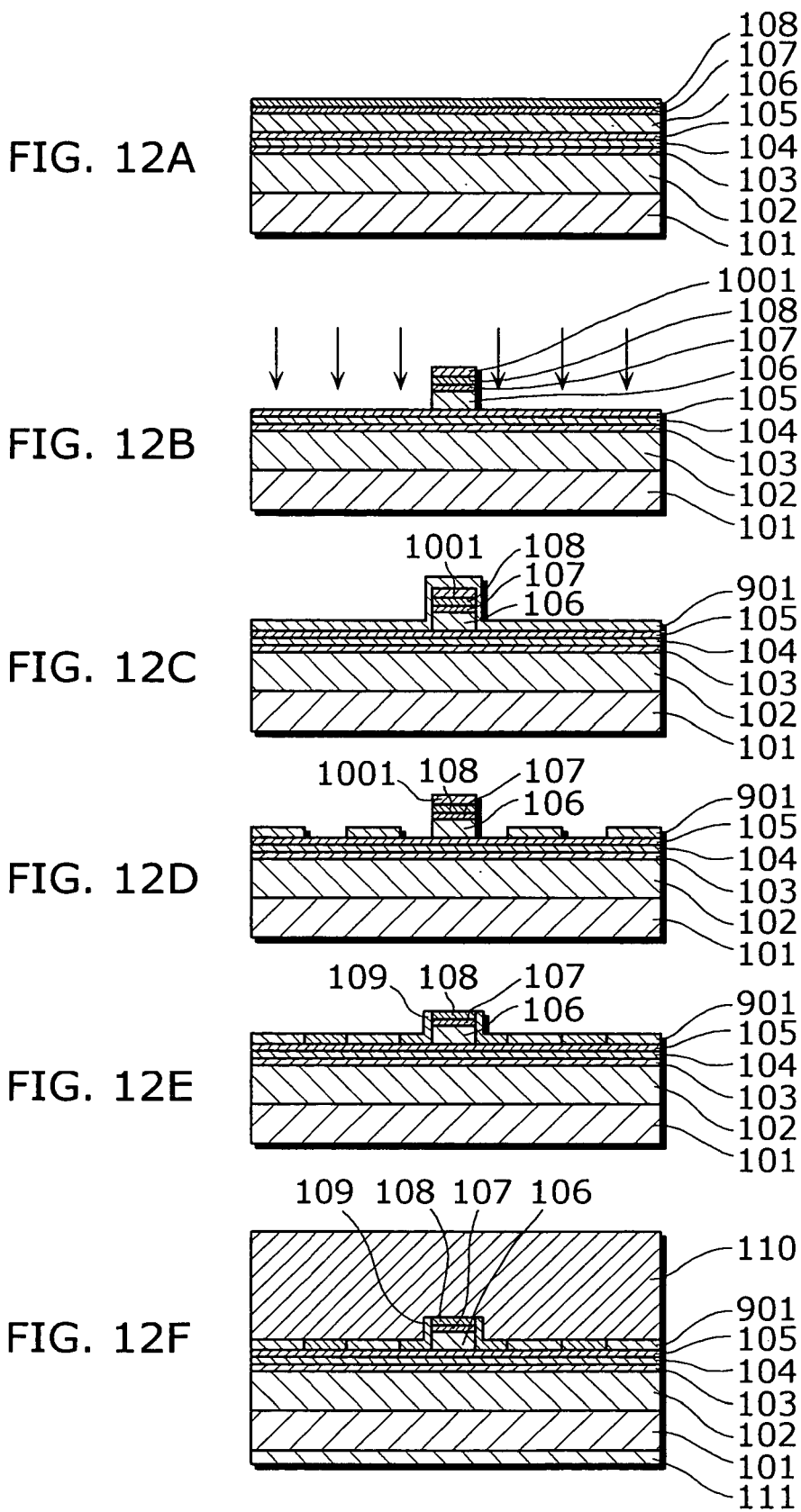

SEMICONDUCTOR LASER DEVICE AND METHOD OF MANUFACTURING THE SAME

BACKGROUND OF THE INVENTION

1. Field of the Invention

The present invention relates to a semiconductor laser device, in particular, to the semiconductor laser device used for an optical disk system, information processing or as a light source for optical communications.

2. Description of the Related Art

Among the various semiconductor laser devices used for the light source for an optical disk system, a ridge semiconductor laser device is mainly used, and there is a tendency that high-speed response (an improvement in speed of response when an optical output rises in response to injected current) as well as high power output for high-speed writing is demanded. In order to achieve the high-speed response, it is necessary to reduce a value of resistance or a capacitance of the laser device.

For the reduction in value of resistance, on one hand, it is efficient to enlarge the area of a contact layer in the region where current is injected. Therefore, for the conventional ridge semiconductor laser device, a ridge portion is rendered more vertical and an area of a contact layer formed as the top layer of the ridge portion is enlarged, for example, by using anisotropic dry etching for ridge formation. Extending a cavity length is also effective for reducing a value of resistance since the extention increases the contact area.

On the other hand, for the reduction in capacitance, it is effective to reduce a capacitance generated as a result of the p-n junction formed between the block layer and the cladding layer. For example, according to the ridge semiconductor laser device disclosed in Japanese Laid-Open Publications No. H8-222801 and No. 2003-188474, a capacitance reduction layer is inserted between the block layer and the cladding layer.

FIG. 1 is a cross-sectional view showing a structure of the conventional ridge semiconductor laser device described in the Japanese Laid-Open Publications mentioned above.

As shown in FIG. 1, an n-type AlGaInP cladding layer 1102, an active layer 1103, a p-type AlGaInP first cladding layer 1104 and a p-type GaInP etching stop layer 1105 are subsequently laminated on an n-type GaAs substrate 1101, composing the conventional ridge semiconductor laser device.

A ridge portion having a predetermined width is formed by laminating a p-type AlGaInP second cladding layer 1107, a p-type GaInP cap layer 1108 and a p-type GaAs first contact layer 1109 on the p-type GaInP etching stop layer 1105. An n-type AlInP block layer 1110 and a capacitance reduction layer 1106 forming a current/light narrowing structure in a state where the p-type GaAs first contact layer 1109 in the ridge portion is open. It should be noted that the capacitance reduction layer 1106 is made of GaAs or AlInP whose impurity concentration is low.

A p-type GaAs second contact layer 1111 is formed on the n-type AlInP block layer 1110 and the p-type GaAs first contact layer 1109.

In the ridge semiconductor laser device composed as described above, a capacitance reduction layer is inserted between the block layer and the cladding layer. It is therefore possible to reduce the capacitance generated as a result of the p-n junction formed between the block layer and the cladding layer, and reduce the capacitance in the laser device.

Another example of the prior art for realizing the reduction of capacitance is described in Japanese Laid-Open Publication No. 2003-46197 as the ridge semiconductor laser device in which a dielectric layer, not a semiconductor layer forms the current/light narrowing structure so as not to form the problematic p-n junction.

FIG. 2 is a cross-sectional view showing the structure of the conventional ridge semiconductor laser device according to the Japanese Laid-Open Publication No. 2003-46197.

As shown in FIG. 2, in the ridge semiconductor laser device according to the Japanese Laid-Open Publication 2003-46197, an n-type AlGaAs cladding layer 1202, an active layer 1203, a p-type AlGaAs first cladding layer 1204 and a p-type AlGaAs etching stop layer 1205 are sequentially laminated on an n-type GaAs substrate 1201.

A ridge portion which has a predetermined width and is formed in stripes and a wing portion that is convex are formed by laminating a p-type AlGaAs second cladding layer 1206 and a p-type GaAs contact layer 1207 on the p-type AlGaAs etching stop layer 1205. A dielectric layer made up of $SiO_2$, $Si_3N_4$ and the like is formed in a state where the p-type GaAs contact layer 1207 is open, so that the current/light narrowing structure is formed.

On the dielectric layer 1208 and the p-type GaAs contact layer 1207, a p-type ohmic electrode 1209 is formed whereas on the n-type GaAs substrate 1201, an n-type ohmic electrode 1210 is formed.

In the ridge semiconductor laser device constructed as above, it is possible to realize the reduction of capacitance since the p-n junction is not formed in the vicinity of the block layer within the device.

However, in the ridge semiconductor laser device according to the Japanese Laid-Open Publications No. H8-222801 and No. 2003-188474, it is not possible to sufficiently reduce the capacitance even with the above solution, since the p-n junction is formed also between the contact layer and the block layer. The problem is that high-speed response cannot be achieved. The semiconductor laser device, in general, has a multi-layered structure formed by crystal growth, which results in the formation of a p-n junction in almost the whole area within the device. This causes another problem in that it is not possible to sufficiently reduce the capacitance even with the above solution, and a high-speed response cannot be realized. In addition, crystal growth is required to be performed three times, which causes a longer lead time and a high price of the chip. The likeliness that a stress at the time of bonding concentrates on the ridge portion when a device is built up using a junction down mounting decreases the reliability of the device.

In the ridge semiconductor laser device according to the Japanese Laid-Open Publication No. 2003-46197, a laser device is manufactured by performing crystal growth one time, the current/light narrowing structure is formed using the dielectric layer, and a wing portion is formed on both sides of the ridge portion. Owing to this, the problems related to high-speed response, lead time, price of a chip and the reliability of the device are respectively resolved. However, another problem is that a refractive index of the practical dielectric layer used for the block layer is small (approximately 2 at minimum) so that there rises a necessity to build a thick cladding layer below the block layer, taking a horizontal angle (Δn: effectual difference in refractive index in and outside the ridge portion) into consideration. This necessity causes an increase in the amount of reactive current, which in turn increases the amount of threshold current. As a result, the temperature characteristic is degraded. Using a dielectric layer which has a thermal conductivity lower than that of a semiconductor layer in order to form the current/light narrowing structure further degrades the temperature characteristic of the device.

SUMMARY OF THE INVENTION

The present invention is conceived in view of the above circumstances, and a first object of the present invention is to provide a semiconductor laser device having a structure which requires a small amount of threshold current and can be manufactured easily as well as having a satisfactory temperature characteristic and high-speed response characteristic.

A second object of the present invention is to provide a semiconductor laser device which has an excellent reliability and can reduce the concentration of stress on the ridge portion when used as a component to build up a device.

In order to achieve the above objects, the semiconductor laser device according to the present invention is a ridge-type laser device comprising: a semiconductor substrate of a first conductivity type; a cladding layer of the first conductivity type formed on the semiconductor substrate of the first conductivity type; an active layer formed on the cladding layer of the first conductivity type; a cladding layer of a second conductivity type which has a striped ridge portion and is formed on the active layer; a contact layer formed only above the cladding layer of the second conductivity type in the ridge portion; and a block layer of the first conductivity type formed on side surfaces of the cladding layer of the second conductivity type and the contact layer.

Thus, the p-n junction is not formed between the block layer and the contact layer, and the amount of capacitance can be sufficiently reduced. It is therefore possible to realize a semiconductor laser device that has a satisfactory high-speed response characteristic. The current/light narrowing structure is formed using the block layer so that the heat generated within the device can escape efficiently. This also contributes to the realization of a semiconductor laser device that has a satisfactory temperature characteristic. Due to the current/light narrowing structure formed by the block layer, there is no need to thicken the thickness of the cladding layer, taking a horizontal angle into consideration. This allows the realization of a semiconductor laser device that requires a small amount of threshold current. The manufacturing of the lazer device based on the crystal growth that is performed two times allows the realization of a semiconductor laser device that enables a reduction in lead time and a reduction in the cost of a chip.

The cladding layer of second conductivity type may further compose striped convex portions on both sides of the ridge portion.

Thus, the convex portion serves to avoid the concentration of the stress at the time of bonding on the ridge portion when a device is built up using a junction down mounting. It is therefore possible to realize a semiconductor laser device with an excellent reliability that can reduce the level of concentration.

The semiconductor laser device may further comprise a dielectric layer formed between the cladding layer of the second conductivity type in the convex portion and the block layer of the first conductivity type.

Thus, the p-n junction is not formed between the block layer and the contact layer, and the amount of capacitance can be sufficiently reduced. It is therefore possible to realize the semiconductor laser device that has a satisfactory high-speed response characteristic. The height of the convex portion is higher than that of the ridge portion so that the amount of capacitance generated as a result of the p-n junction formed between the block layer and the cladding layer can be reduced. This can prevent the concentration of the stress at the time of bonding on the ridge portion when a device is built up using a junction down mounting. It is therefore possible to realize the semiconductor laser device with an excellent reliability by which the level of concentration can be reduced.

The cladding layer of the second conductivity type may compose two or more convex portions, and the ridge-type laser device may further comprise a dielectric layer formed above the cladding layer of the second conductivity type in the convex portion.

Thus, the width of the wing portion is narrowed, which prevents the block layer from poly-growing on the dielectric layer on the convex portion. It is therefore possible to realize a semiconductor laser device that prevents the block layer from coming off.

The ridge-type laser device may further comprise stripe-like dielectric layers formed between the cladding layer of the second conductivity type and the block layer of the first conductivity type on both sides of the ridge portion.

Thus, the block layer is formed on the dielectric layer, and the amount of capacitance generated as a result of the p-n junction formed between the block layer and the cladding layer can be reduced. It is therefore possible to realize the semiconductor laser device that has a satisfactory high-speed response characteristic.

The ridge-type laser device may further comprise two or more dielectric layers formed above the cladding layer of the second conductivity type on both sides of the ridge portion.

The formation of the block layer between the dielectric layers allows the realization of the semiconductor laser device that has a satisfactory temperature characteristic. The width of the dielectric layer is narrowed, which prevents the block layer from poly-growing on the dielectric layer of the convex portion. It is therefore possible to realize the semiconductor laser device that prevents the block layer from coming off.

The present invention is also a ridge-type laser device comprising: a semiconductor substrate of a first conductivity type; a cladding layer of the first conductivity type formed on the semiconductor substrate of the first conductivity type; an active layer formed on the cladding layer of the first conductivity type; a cladding layer of a second conductivity type that has a striped ridge portion and striped convex portions that are formed on both sides of the ridge portion, the cladding layer being formed on the active layer; a dielectric layer formed only above the cladding layer of the second conductivity type in the convex portion; and a block layer of the first conductivity type formed at least between the ridge portion and the convex portion and on side surfaces of the cladding layer of the second conductivity type. The block layer of the first conductivity type may be further formed on the dielectric layer, or, the cladding layer of the second conductivity type may compose two or more convex portions, and the block layer of the first conductivity type may be further formed between the two or more convex portions and on the side surfaces of the cladding layer of the second conductivity type.

Thus, the block layer is formed on the dielectric layer in the convex portion, and the amount of capacitance generated as a result of the p-n junction formed between the block layer and the cladding layer can be reduced. It is therefore possible to realize the semiconductor laser device that has a satisfactory high-speed response characteristic. The height of the convex portion can be made higher than that of the ridge portion so that the concentration of the stress at the time of bonding caused on the ridge portion when a device is built up using a junction down mounting can be prevented. It is therefore possible to realize the semiconductor laser device with an excellent reliability by which the level of concentration can be reduced. The formation of the block layer in the vicinity of the ridge portion where the temperature gets higher due to the laser oscillation allows the generated heat to escape effectively. It is therefore possible to realize the semiconductor laser device that has a satisfactory temperature characteristic.

The present invention is a method for manufacturing a ridge-type laser device, comprising: growing a cladding layer of a first conductivity type, an active layer, a cladding layer of a second conductivity type and a contact layer sequentially by deposition on a semiconductor substrate of the first conductivity type; forming at least a ridge portion by etching predetermined areas of the cladding layer of the second conductivity type and the contact layer; growing a block layer selectively on side surfaces of the cladding layer of the second conductivity type in the ridge portion; and forming an electrode on the block layer and on the contact layer that constitutes the ridge portion. Here, in the formation of the ridge portion, a mask pattern may be formed on the contact layer using a dielectric layer, and the dielectric layer may be removed only for the ridge portion after the etching is performed on the cladding layer of the second conductivity type and the contact layer, and in the selective growth of the block layer, the block layer may further grow selectively on both sides of the convex portion, using the dielectric layer in the convex portion as a mask, or, in the formation of the ridge portion, two or more of the convex portions may be formed, and in the formation of the ridge portion, a mask pattern may be formed on the contact layer using a dielectric layer, and the dielectric layer may be removed only for the ridge portion after the etching is performed on the cladding layer of the second conductivity type and the contact layer. Also, in the formation of the ridge portion, stripe-like dielectric layers may be further formed above the cladding layer of the second conductivity on both sides of the ridge portion, and in the selective growth of the block layer, the block layer further may grow selectively on both sides of the stripe-like dielectric layer, using the stripe-like dielectric layer as a mask, or, in the formation of the ridge portion, a plurality of stripe-like dielectric layers may be further formed above the cladding layer of the second conductivity type on both sides of the ridge portion.

Thus, it is possible to realize the method of manufacturing the semiconductor laser device which requires a small amount of threshold current, and has satisfactory temperature and high-speed characteristics as well as a simple structure that is easy to make.

In the formation of the ridge portion, convex portions may be formed further on both sides of the ridge portion.

Thus, it is possible to realize the method of manufacturing the semiconductor laser device with an excellent reliability by which the level of concentration on the ridge portion can be reduced.

The present invention is also a method for manufacturing a ridge-type laser device, comprising: growing a cladding layer of a first conductivity type, an active layer and a cladding layer of a second conductivity type sequentially by deposition on a semiconductor substrate of the first conductivity type; forming a ridge portion and convex portions that are formed on both sides of the ridge portion, by etching the cladding layer of the second conductivity type after forming a mask pattern on the cladding layer of the second conductivity type using a dielectric layer; removing only the dielectric layer for the ridge portion; and forming a block layer at least between the ridge portion and the convex portion and on side surfaces of the cladding layer of the second conductivity type. Here, the formation of the block layer between the ridge portion and the convex portion may be performed by growing the block layer selectively on the cladding layer of the second conductivity type and the dielectric layer, or in the formation of the ridge portion, two or more of the convex portions may be formed, and the formation of the block layer between the ridge portion and the convex portion may be performed by growing the block layer selectively on the cladding layer of the second conductivity type.

Thus, it is possible to realize the semiconductor laser device which requires a small amount of threshold current, reduces the concentration on the ridge portion, and has a simple structure to make as well as satisfactory temperature and high-speed response characteristics. Since the process of removing the dielectric layer from the convex portion can be omitted, it is possible to realize the method of manufacturing the semiconductor laser device that simplifies the manufacturing process.

As is obvious from the above description, according to the semiconductor laser device of the present invention, it is possible to realize the semiconductor laser device which requires a small amount of threshold current and has satisfactory high-speed response and temperature characteristics as well as a simple structure for easy manufacturing. Such semiconductor laser device can abbreviate lead time and reduce the price of a chip. It is also possible to realize the semiconductor laser device with an excellent reliability by which the level of concentration on the ridge portion can be reduced when a device is built-up using a junction down mounting.

Therefore, the present invention provides the semiconductor laser device which requires a small amount of threshold current and has satisfactory temperature and high-speed response characteristics, and its practical value is quite high.

FURTHER INFORMATION ABOUT TECHNICAL BACKGROUND TO THIS APPLICATION

The disclosure of Japanese Patent Application No. 2003-394381 filed on Nov. 25, 2003 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 12 is a cross-sectional view for explaining the method of manufacturing the semiconductor laser device according to the fifth embodiment.

DESCRIPTION OF THE PREFERRED EMBODIMENT(S)

The following describes the semiconductor laser device according to the embodiments of the present invention.

First Embodiment

Figure 1:
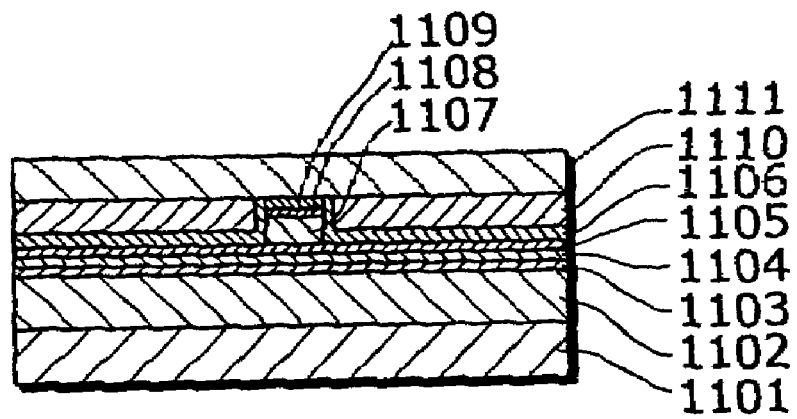
FIG. 1 is a cross-sectional view of the structure of a conventional ridge semiconductor laser device.
Figure 2:
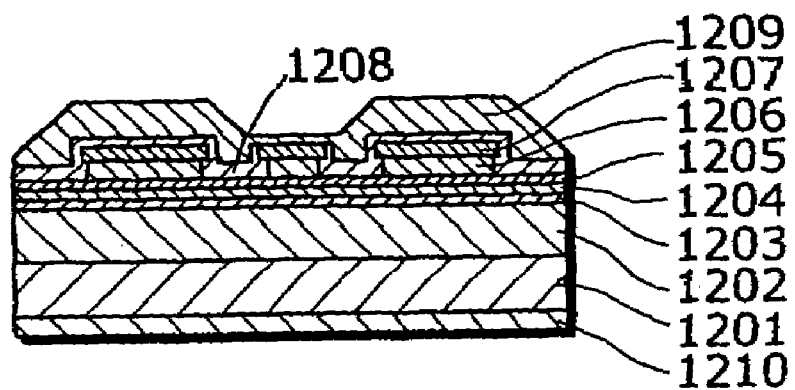
FIG. 2 is a cross-sectional view of the structure of another conventional ridge semiconductor laser device.
Figure 3:
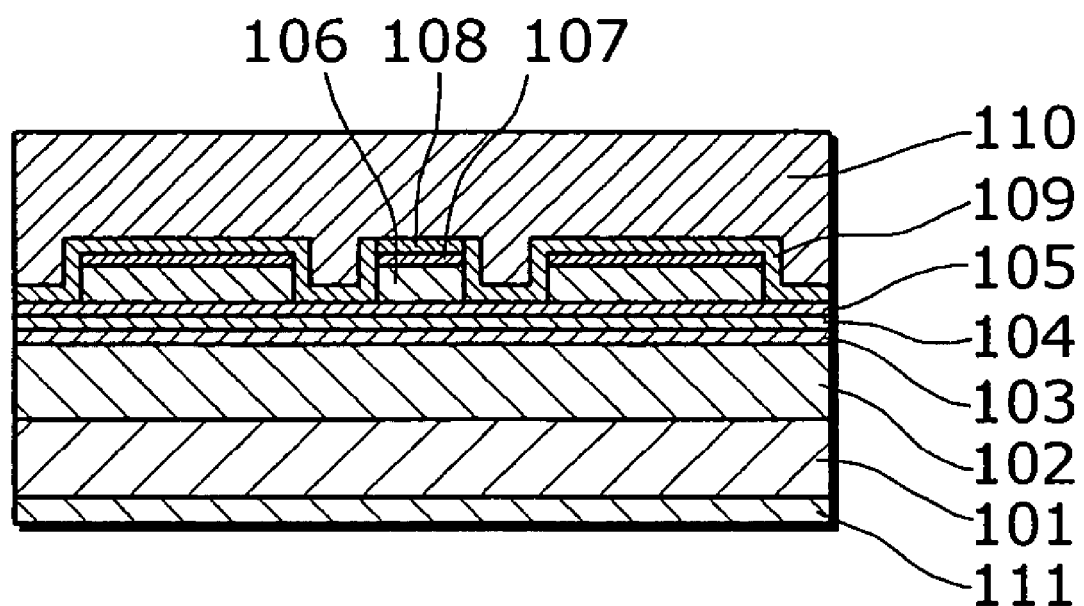
FIG. 3 is a cross-sectional view of the structure of a semiconductor laser device according to a first embodiment of the present invention.

FIG. 3 is a cross-sectional view showing the structure of a semiconductor laser device according to a first embodiment.

The semiconductor laser device according to the present embodiment is a ridge semiconductor laser device formed by sequentially laminating the following on an n-type GaAs substrate 101: an n-type AlGaInP cladding layer 102 having a thickness of 2 μm, formed by doping n-type impurities at a concentration of $1 \times 10^{18}$ cm$^{-3}$; a non-doped quantum well active layer 103; a p-type AlGaInP first cladding layer 104 having a thickness of 0.2 μm, formed by doping with p-type impurities having a concentration of $1 \times 10^{18}$ cm$^{-3}$; and a p-type GaInP etching stop layer 105 having a thickness of 10 nm, formed by doping with p-type impurities having a concentration of $1 \times 10^{18}$ cm$^{-3}$.

On the p-type GaInP etching stop layer 105, a striped ridge portion is formed by sequentially laminating the following: a p-type AlGaInP second cladding layer 106 having a thickness of 1.2 μm, formed by doping p-type impurities at a concentration of $1 \times 10^{18}$ cm$^{-3}$; a p-type GaInP cap layer 107 having a thickness of 50 nm, formed by doping p-type impurities at a concentration of $1 \times 10^{18}$ cm$^{-3}$; and a p-type GaAs contact layer 108 having a thickness of 0.2 μm, formed by doping p-type impurities at a concentration of $1 \times 10^{19}$ cm$^{-3}$. On both sides of the ridge portion, a wing portion which is a striped convex portion and has a predetermined width is formed. The wing portion is formed by laminating the p-type AlGaInP second cladding layer 106 and the p-type GaInP cap layer 107. An n-type AlInP block layer 109 forming a current/light narrowing structure is further formed in a state where the p-type GaAs contact layer 108 in the ridge portion is open (i.e., not covered). That is to say that the n-type AlInP block layer 109 is formed between the ridge portion and the convex portion covering the side surface of the p-type AlGaInP second cladding layer 106 and the p-type GaAs contact layer 108 of the ridge portion as well as on the p-type AlGaInP second cladding layer 106 in the convex portion. Here, the width of the bottom part of the ridge portion (a stripe width) is determined, for example, as 2–3 μm considering selective growth of the n-type AlInP block layer 109. It should be noted that the refractive index of the n-type AlInP block layer 109 is smaller than that of the p-type AlGaInP second cladding layer 106.

On the p-type GaAs contact layer 108 and the n-type AlInP block layer 109, a p-type ohmic electrode 110 is formed while on the n-type GaAs substrate 101, an n-type ohmic electrode 111 is formed.

The non-doped quantum well active layer 103 has a tri-layered quantum well structure formed by laminating a GaInP well layer with a thickness of 6 nm, an AlGaInP blocking layer with a thickness of 4 nm and an AlGaInP guide layer with a thickness of 35 nm.

Next, the following explains the method of manufacturing the semiconductor laser device having the structure as described above, with reference to the cross-sectional view shown in FIG. 4. It should be noted that the same marks are put for the same components as those shown in FIG. 3, and the detailed description for such components is omitted here.

Figure 4A:
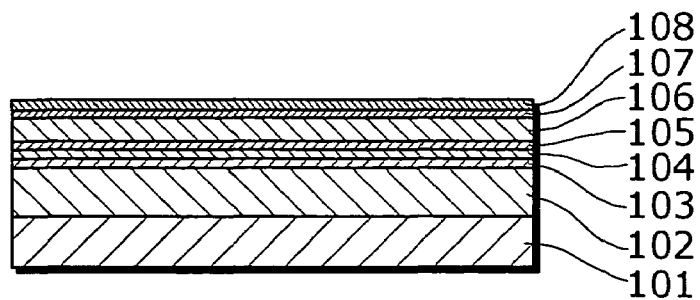
FIG. 4 is a cross-sectional view for explaining the method of manufacturing the semiconductor laser device according to the first embodiment.

As shown in FIG. 4A, the n-type GaAs substrate 101 is placed in a crystal growth apparatus, and then the n-type AlGaInP cladding layer 102, the non-doped quantum well active layer 103, the p-type AlGaInP first cladding layer 104, the p-type GaInP etching stop layer 105, the p-type AlGaInP second cladding layer 106, the p-type GaInP cap layer 107 and the p-type GaAs contact layer 108 are allowed to grow by depositing them on the n-type GaAs substrate 101.

Figure 4B:
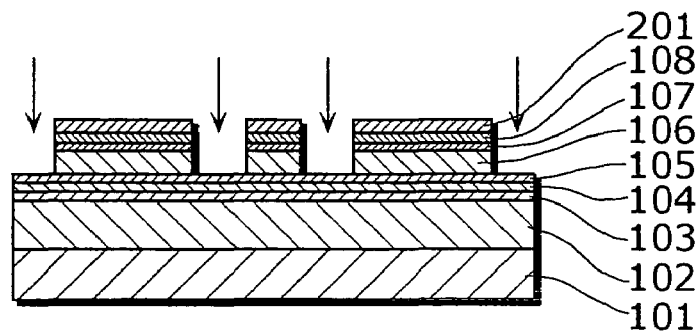

Then, as shown in FIG. 4B, an SiO$_2$ layer is deposited, until the thickness amounts to 0.3 μm, on the n-type GaAs substrate 101 on which the semiconductor layer is formed as described above, pattern formation is performed onto the layer using a well-known photolithographic technology so that an SiO$_2$ mask 201 is formed in stripes on the p-type GaAs contact layer 108. Then, a ridge portion and a wing portion are formed by etching the p-type GaAs contact layer 108, the p-type GaInP cap layer 107 and the p-type AlGaInP second cladding layer 106 so as to form striped trenches by use of a well-known selective etching technique where the SiO$_2$ mask 201 is used as an etching mask, until it reaches the p-type GaInP etching stop layer 105. Either a wet etching using a sulfuric acid solution or a dry etching is employed for the selective etching performed for the GaInP layer while either a wet etching using a solution composed of water, sulfuric acid and oxygenated water or a dry etching is employed for the selective etching performed for the GaAs layer.

Figure 4C:
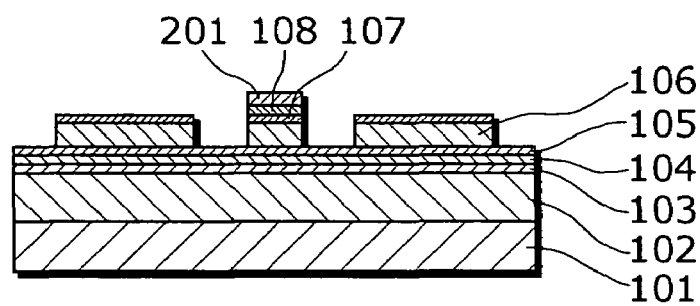

As shown in FIG. 4C, the SiO$_2$ mask 201 on the wing portion is removed using the well-known photolithographic technology.

Figure 4D:
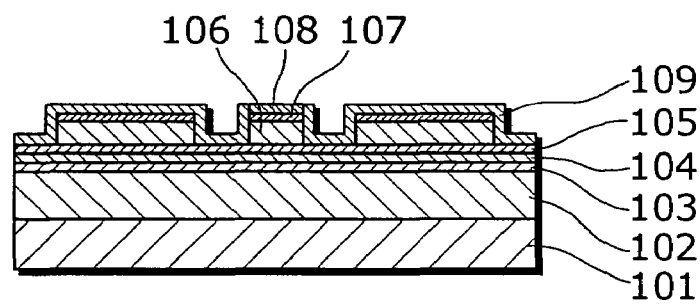

As shown in FIG. 4D, the SiO$_2$ mask 201 on the ridge portion is removed after the n-type AlInP block layer 109 grows, by a second crystal growth, on the p-type GaInP etching stop layer 105 as well as on the side surfaces of the p-type GaAs contact layer 108 and the p-type AlGaInP second cladding layer 106. Here, the width of the ridge portion being narrow, the n-type AlInP block layer 109 grows selectively on the region other than the SiO$_2$ mask 201.

Figure 4E:
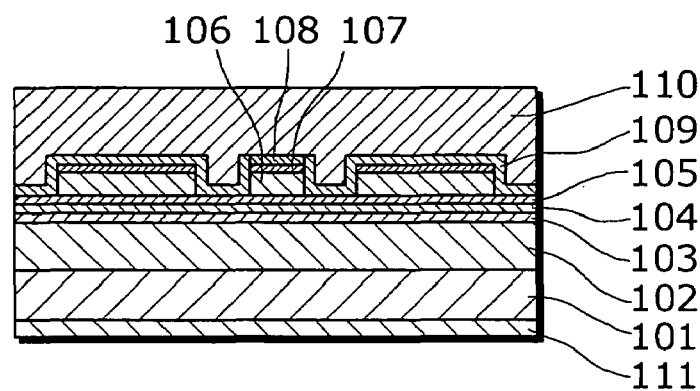

As shown in FIG. 4E, the p-type ohmic electrode 110 is formed on the p-type GaAs contact layer 108 at the ridge portion and on the n-type AlInP block layer 109 while the n-type ohmic electrode 111 is formed on the n-type GaAs substrate 101. After adjusting the cavity length to 900–1100 μm based on a cleavage method, coating films (not shown in the diagram) are formed with 5% reflectivity for the outgoing side and with 95% reflectivity for the reflection side, respectively.

As described above, according to the semiconductor laser device of the present embodiment, the p-type GaAs contact layer 108 is formed only on the ridge portion. A p-n junction is therefore not formed between the n-type AlInP block layer and the p-type GaAs contact layer, which reduces the p-n junction area formed in the vicinity of the n-type AlInP block layer into half of the conventional size, and thus allows a sufficient reduction of the capacitance. Consequently, it is possible to realize a semiconductor laser device that has a satisfactory high-speed response characteristic.

The semiconductor laser device according to the present embodiment also allows a current/light narrowing structure formed by the n-type AlInP block layer 109. Thus, heat generated in the device at the time of oscillation at high temperature or with high power is allowed to escape effectively. It is therefore possible to realize the semiconductor laser device that has a satisfactory temperature characteristic. As there is no need to make the cladding layer thick considering the horizontal angle, it is possible to realize the semiconductor laser device that requires a small amount of threshold current.

According to the semiconductor laser device of the present embodiment, a process of embedding crystal growth can be omitted and the semiconductor laser device is manufactured by performing crystal growth two times. Performing crystal growth fewer times in the manufacturing of the semiconductor laser device realizes the semiconductor laser device with a simple structure that can be easily manufactured. That is to say that the semiconductor laser device allows an abbreviation of lead time, and a reduction in the price of a chip can be realized.

The semiconductor laser device of the present embodiment has a wing portion formed on both sides of the ridge portion. As it is possible to avoid the concentration of stress on the ridge portion at the time of bonding when a device is built up using a junction down, mounting, the semiconductor laser device with excellent reliability that can reduce the concentration of stress on the ridge portion can be realized.

It is described that the wing portion is formed on both sides of the ridge portion. However, the formation of a wing portion may not be required. Without the wing portion, the stress is likely to concentrate on the ridge portion at the time of bonding. It is possible, however, to avoid such concentration by forming a thick p-type ohmic electrode, reducing a difference in temperature between a heat sink and a chip by heating the chip when the heat sink and the chip are joined, or controlling exactly the temperature of the solder used for joining the heat sink and the chip. Such semiconductor laser device is manufactured by the formation of a mask pattern using $SiO_2$, by which a wing portion is not formed, as can be seen in the process shown in FIG. 4B.

According to the present embodiment, the semiconductor laser device is manufactured using materials of AlGaInP, but other kinds of materials, for example, materials of AlGaAs can be used instead.

Second Embodiment

Figure 5:
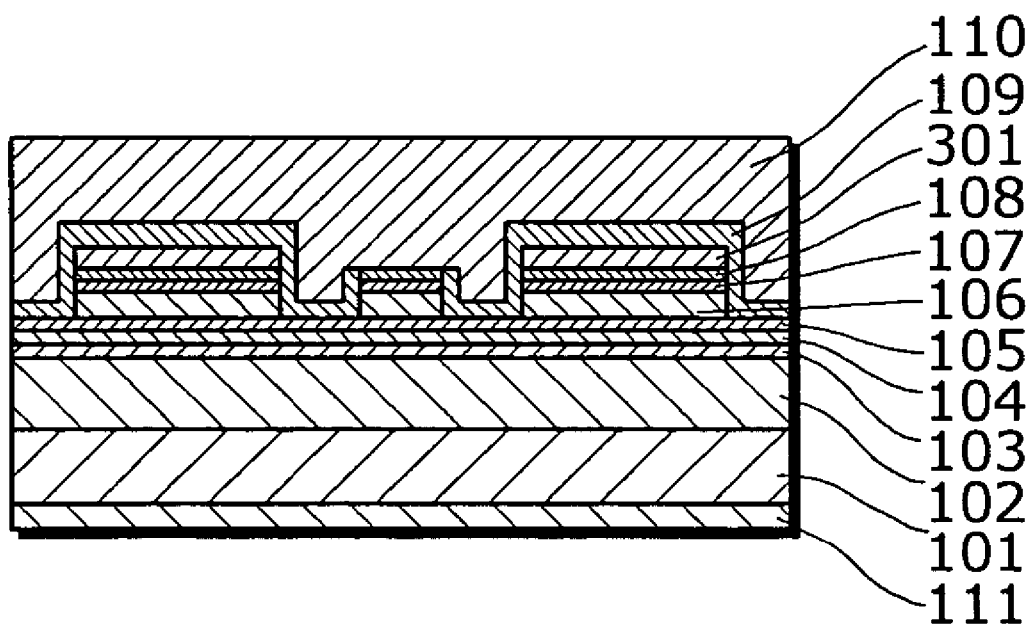
FIG. 5 is a cross-sectional view showing the structure of a semiconductor laser device according to a second embodiment.

FIG. 5 is a cross-sectional view showing the structure of the semiconductor laser device according to the second embodiment. It should be noted that the same marks are used for the same components as those shown in FIG. 3, and the detailed description for such components is omitted here.

The semiconductor laser device of the present embodiment is different from that of the first embodiment in that the $SiO_2$ layer is formed in the wing portion. In the present semiconductor laser device, the n-type AlGaInP cladding layer 102, the non-doped quantum well active layer 103, the p-type AlGaInP first cladding layer 104 and the p-type GaInP etching stop layer 105 are sequentially laminated on the n-type GaAs substrate 101.

Here, on the p-type GaInP etching stop layer 105, a ridge portion is formed by sequentially laminating the p-type AlGaInP second cladding layer 106, the p-type GaInP cap layer 107 and the p-type GaAs contact layer 108. On both sides of the ridge portion, a wing portion is formed by laminating the p-type AlGaInP second cladding layer 106, the p-type GaInP cap layer 107, the p-type GaAs contact layer 108 and an $SiO_2$ mask layer 301 with a thickness of 0.3 μm. The p-type GaAs contact layer 108 in the ridge portion is open, and the n-type AlInP block layer 109 forms a current/light narrowing structure. The width of the wing portion, in this case, is determined according to the width of the bottom part of the ridge portion and the width of the semiconductor laser device as a whole. For instance, in the case where the semiconductor laser device has a width of 200–300 μm and the bottom part of the ridge portion has a width of 2–3 μm, the width of the wing portion is determined as approximately 100 μm.

The p-type ohmic electrode 110 is formed on the p-type GaAs contact layer 108 and the n-type AlInP block layer 109 while the n-type ohmic electrode 111 is formed on the n-type GaAs substrate 101.

The following describes the method of manufacturing the semiconductor laser device having the structure as described above, with reference to the cross-sectional view shown in FIG. 6. It should be noted that the same marks are put for the same components as those in FIG. 5, and the detailed description for such components is omitted here.

Figure 6A:
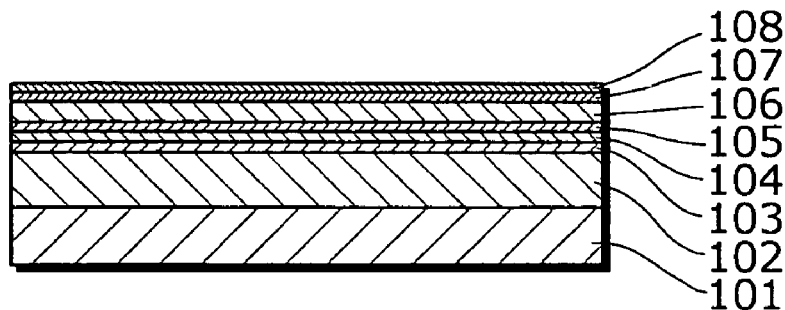
FIG. 6 is a cross-sectional view for explaining the method of manufacturing the semiconductor laser device according to the second embodiment.

As shown in FIG. 6A, the n-type GaAs substrate 101 is firstly placed within a crystal growth apparatus. The n-type AlGaInP cladding layer 102, the non-doped quantum well active layer 103, the p-type AlGaInP first cladding layer 104, the p-type GaInP etching stop layer 105, the p-type AlGaInP second cladding layer 106, the p-type GaInP cap layer 107 and the p-type GaAs contact layer 108 sequentially grow by deposition on the n-type GaAs substrate 101.

Figure 6B:
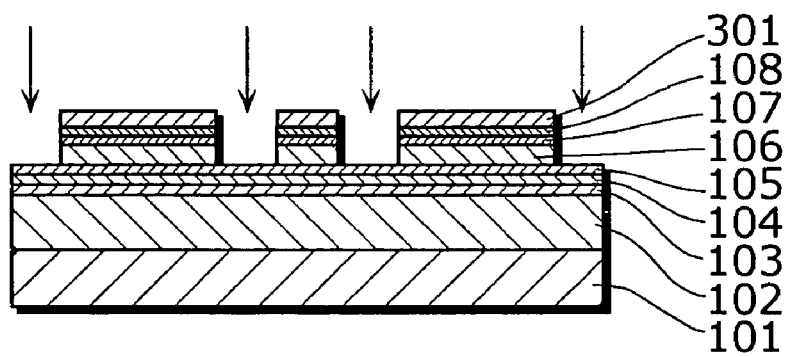

Then, as shown in FIG. 6B, an $SiO_2$ layer is deposited, until the thickness amounts to 0.3 μm. On the n-type GaAs substrate 101 on which the semiconductor layer is formed as described above, pattern formation is performed onto the layer using a prior art process of photolithographic technology while an $SiO_2$ mask 301 is formed in stripes on the p-type GaAs contact layer 108. Then, a ridge portion and a wing portion are formed by etching the p-type GaAs contact layer 108, the p-type GaInP cap layer 107 and the p-type AlGaInP second cladding layer 106 so as to form striped trenches, employing a prior art of a selective etching technique where the $SiO_2$ mask 301 is used as an etching mask, until it reaches the p-type GaInP etching stop layer 105. The etching solution used for the selective etchings respectively performed for the GaInP layer and the GaAs layer is the same as the one used in the first embodiment.

Figure 6C:
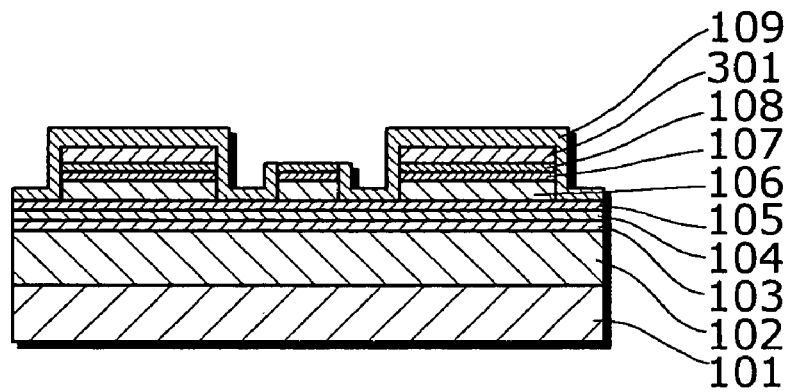

As shown in FIG. 6C, the $SiO_2$ mask 301 on the ridge portion is removed after the n-type AlInP block layer 109 grows, by a second crystal growth, on the $SiO_2$ mask 301 and the p-type GaInP etching stop layer 105 as well as on the side surfaces of the p-type GaAs contact layer 108 and the p-type AlGaInP second cladding layer 106. Here, the width of the ridge portion being narrow, the n-type AlInP block layer 109 grows by selective growth on the region other than the SiO$_2$ mask 301. The n-type AlInP block layer 109 grows by poly growth on the SiO$_2$ mask 301 of the wing portion.

Figure 6D:
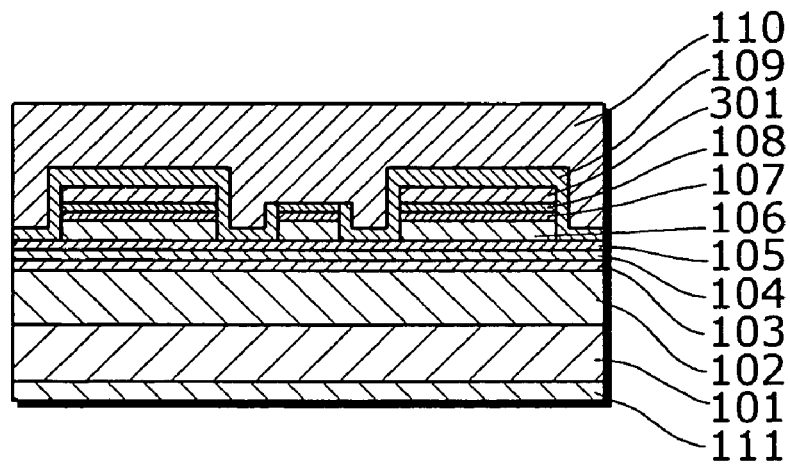

As shown in FIG. 6D, the p-type ohmic electrode 110 is formed on the p-type GaAs contact layer 108 and the n-type AlInP block layer 109 whereas the n-type ohmic electrode 111 is formed on the n-type GaAs substrate 101. By adjusting the cavity length to 900–1100 μm based on a cleavage method, a coating film (not shown in the diagram) is formed with 5% reflectivity for the outgoing side and with 95% reflectivity for the reflection side, respectively.

As described above, according to the semiconductor laser device of the present embodiment, the n-type AlInP block layer 109 is formed on the SiO$_2$ mask 301 in the wing portion. This allows the reduction of capacitance generated as a result of the p-n junction formed between the block layer and the cladding layer so that it is possible to realize the semiconductor laser device that has a satisfactory high-speed response characteristic.

The semiconductor laser device according to the present embodiment reduces the capacitance generated as a result of the p-n junction formed between the block layer and the cladding layer by making use of the SiO$_2$ mask 301 for forming the ridge portion and the wing portion. As the process of removing the SiO$_2$ mask on the wing portion after the formation of the ridge portion and the wing portion can be omitted, the semiconductor laser device that has a simple structure that is easy to manufacture can be realized.

According to the semiconductor laser device of the present embodiment, the wing portion is formed at both sides of the ridge portion while the SiO$_2$ mask 301 is formed on the wing portion. This allows the height of the wing portion to be higher than that of the ridge portion, and prevents the concentration of stress on the ridge portion at the time of bonding when a device is built up using a junction down mounting. The semiconductor laser device which offers an excellent reliability for reducing such concentration can be therefore realized.

According to the semiconductor laser device of the present embodiment, the n-type AlInP block layer 109 is formed in the vicinity of the ridge portion where the temperature gets higher due to laser oscillation. Thus, it is possible, with the semiconductor laser device of the present embodiment, to allow the heat generated in the device at the time of oscillation at high temperature and with high power to escape efficiently. The semiconductor laser device that has a satisfactory temperature characteristic can therefore be realized.

It should be noted that the SiO$_2$ mask 301 is formed on the p-type GaAs contact layer 108 in the semiconductor laser device of the present embodiment. The SiO$_2$ mask 301, however, may be formed on the p-type GaInP cap layer or on the p-type AlGaInP second cladding layer.

Although an SiO$_2$ layer is taken as an example of the dielectric layer formed in the wing portion, the present invention is not limited to this.

Third Embodiment

Figure 7:
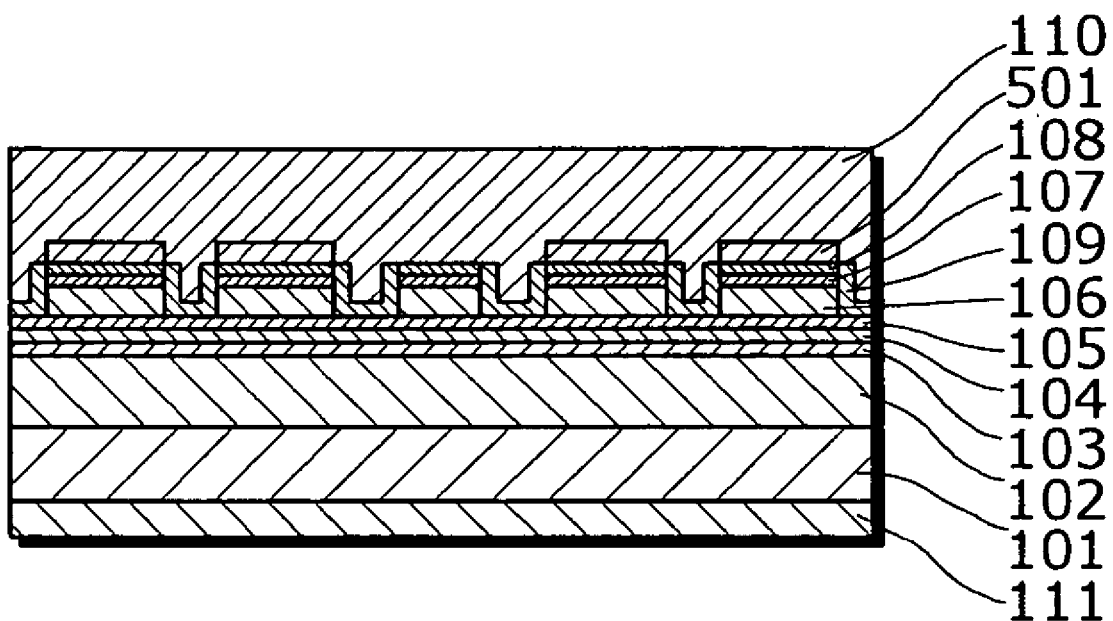
FIG. 7 is a cross-sectional view showing the structure of a semiconductor laser device according to a third embodiment.

FIG. 7 is a cross-sectional view showing the structure of the semiconductor laser device according to the third embodiment. The same marks are used for the same components as those shown in FIG. 5, and the detailed description for such components is omitted here.

The semiconductor laser device of the present embodiment differs from that of the second embodiment in that the former has plural wing portions, each having a smaller width. In the present semiconductor laser device, the n-type AlGaInP cladding layer 102, the non-doped quantum well active layer 103, the p-type AlGaInP first cladding layer 104 and the p-type GaInP etching stop layer 105 are sequentially laminated on the n-type GaAs substrate 101.

Here, on the p-type GaInP etching stop layer 105, a ridge portion is formed by sequentially laminating the p-type AlGaInP second cladding layer 106, the p-type GaInP cap layer 107 and the p-type GaAs contact layer 108. On both sides of the ridge portion, plural wing portions are formed at intervals by laminating the p-type AlGaInP second cladding layer 106, the p-type GaInP cap layer 107, the p-type GaAs contact layer 108 and an SiO$_2$ mask 501 with a thickness of 0.3 μm. The p-type GaAs contact layer 108 in the ridge portion and the SiO$_2$ mask 501 in the wing portion are open (i.e., not covered), and the n-type AlInP block layer 109 forms a current/light narrowing structure. That is to say, the n-type AlInP block layer 109 is formed between the ridge portion and the convex portion and on the side surfaces of the p-type AlGaInP second cladding layer 106 and the p-type GaAs contact layer 108 as well as between the convex portions. The width of the wing portion and the distance between the wing portions, in this case, are determined considering the selective growth of the n-type AlInP block layer 109, the width of the bottom part of the ridge portion and the width of the semiconductor laser device as a whole. For instance, in the case where the width of the semiconductor laser device is 200–300 μm and the width of the bottom part of the ridge portion is 2–3 μm, the width of the wing portion is determined to be 3–100 μm and the distance between the wing portions is determined to be 3–20 μm.

The p-type ohmic electrode 110 is formed on the p-type GaAs contact layer 108 and the n-type AlInP block layer 109 while the n-type ohmic electrode 111 is formed on the n-type GaAs substrate 101.

The following describes the method of manufacturing the semiconductor laser device having the structure as described above, with reference to the cross-sectional view shown in FIG. 8. It should be noted that the same marks are put for the same components as those shown in FIG. 7, and the detailed description for such components is omitted here.

Figure 8A:
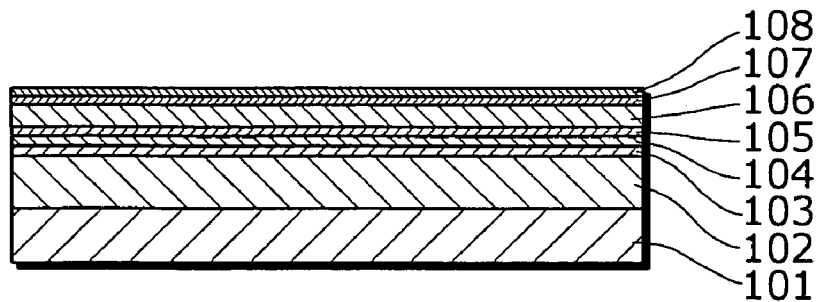
FIG. 8 is a cross-sectional view for explaining the method of manufacturing the semiconductor laser device according to the third embodiment.
Figure 8B:
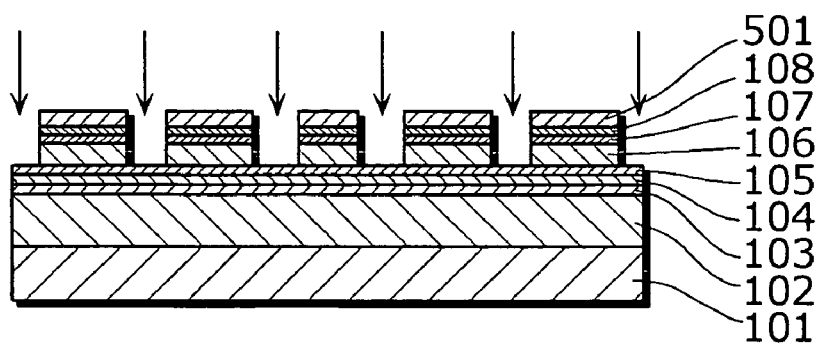

As shown in FIG. 8A, the n-type GaAs substrate 101 is firstly placed in a crystal growth apparatus, and on the n-type GaAs substrate 101, the n-type AlGaInP cladding layer 102, the non-doped quantum well active layer 103, the p-type AlGaInP first cladding layer 104, the p-type GaInP etching stop layer 105, the p-type AlGaInP second cladding layer 106, the p-type GaInP cap layer 107 and the p-type GaAs contact layer 108 are sequentially laminated by a first crystal growth.

As shown in 8B, an SiO$_2$ layer is deposited, until the thickness amounts to 0.3 μm. On the n-type GaAs substrate 101 on which the semiconductor layer is formed as described above, pattern formation is performed onto the layer using the photolithographic technology while an SiO$_2$ mask 501 is formed in stripes on the p-type GaAs contact layer 108. Then, a ridge portion and a wing portion are formed by etching the p-type GaAs contact layer 108, the p-type GaInP cap layer 107 and the p-type AlGaInP second cladding layer 106 so as to form striped trenches, employing the selective etching technique where the SiO$_2$ mask 501 is used as an etching mask, until it reaches the p-type GaInP etching stop layer 105. The etching solution used for the selective etchings respectively performed for the GaInP layer and the GaAs layer is the same as the one used in the second embodiment.

Figure 8C:
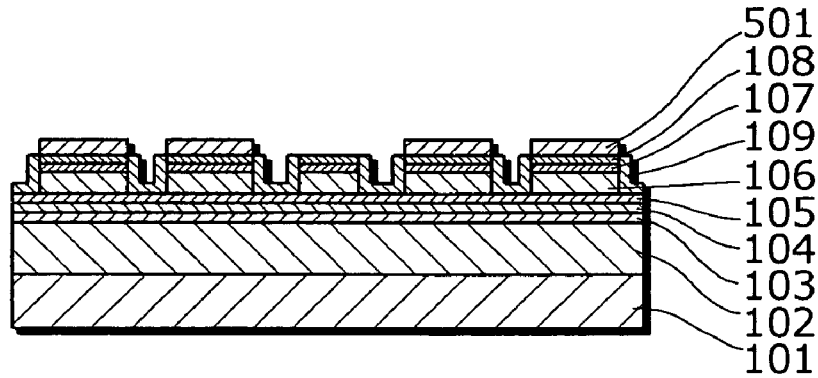

As shown in FIG. 8C, the SiO$_2$ mask 501 on the ridge portion is removed after the n-type AlInP block layer 109 grows, by a second crystal growth, on the p-type GaInP etching stop layer 105 as well as on the side surfaces of the p-type GaAs contact layer 108 and the p-type AlGaInP second cladding layer 106. Here, the width of the ridge portion and the wing portion being narrow, the n-type AlInP block layer 109 grows by selective growth on the ridge portion and the wing portion aside for the SiO$_2$ mask 501.

Figure 8D:
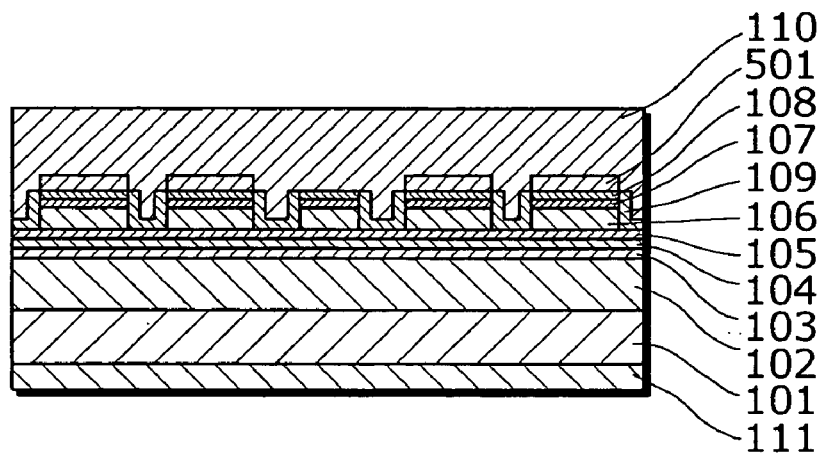

As shown in FIG. 8D, the p-type ohmic electrode 110 is formed on the p-type GaAs contact layer 108 and the n-type AlInP block layer 109 whereas the n-type ohmic electrode 111 is formed on the n-type GaAs substrate 101. By adjusting the cavity length to 900–1100 μm based on a cleavage method, a coating film (not shown in the diagram) is formed with 5% reflectivity for the outgoing side and with 95% reflectivity for the reflection side, respectively.

As described above, according to the semiconductor laser device of the present embodiment, the width of the wing portion is narrow and the n-type AlInP block layer 109 grows by selective growth on the region other than the SiO$_2$ mask 501 on the wing portion. Thus, as the n-type AlInP block layer does not grow by poly growth on the SiO$_2$, the semiconductor laser device that prevents the n-type AlInP block layer from coming off can be realized.

According to the semiconductor laser device of the present embodiment, the SiO$_2$ mask 501 is formed on the wing portion while plural wing portions of the same are formed on both sides of the ridge portion at intervals. Thus, the region within the device which is not covered by the SiO$_2$ becomes larger, and as a result, the heat generated in the device at the time of oscillation at high temperature and with high power is allowed to escape efficiently, for instance. The semiconductor laser device that has a satisfactory temperature characteristic can be therefore realized.

Fourth Embodiment

Figure 9:
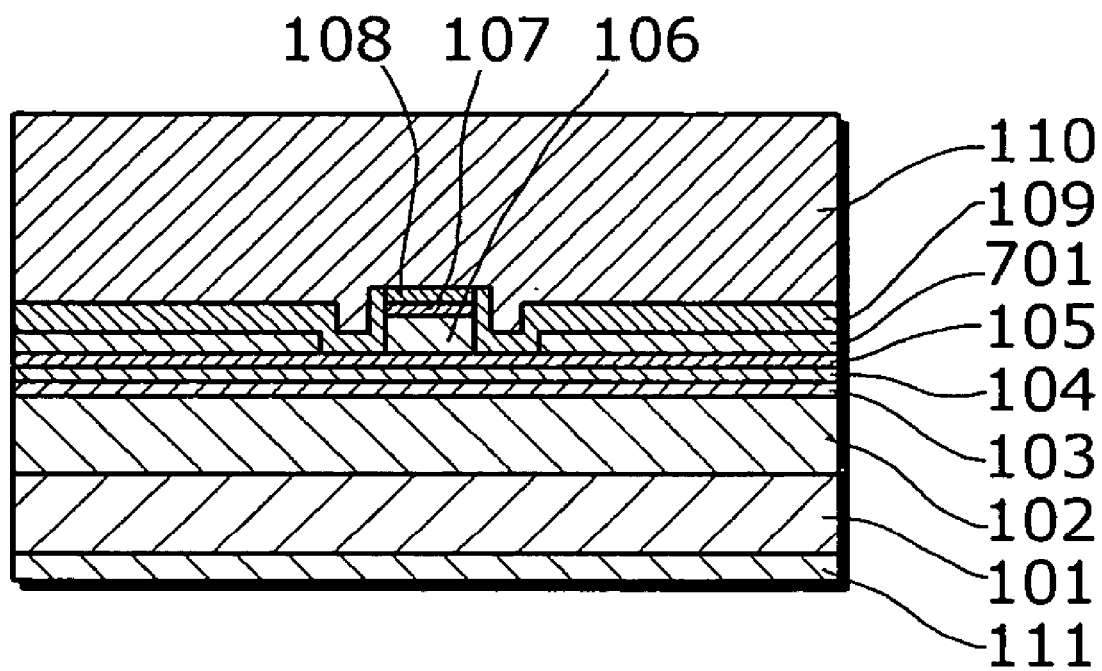
FIG. 9 is a cross-sectional view showing the structure of a semiconductor laser device according to a fourth embodiment.

FIG. 9 is a cross-sectional view showing the structure of the semiconductor laser device according to the fourth embodiment. It should be noted that the same marks are used for the same components as those shown in FIG. 3, and the detailed description for such components is omitted here.

The semiconductor laser device according to the present embodiment differs from that of the first embodiment in that a wing portion is not formed. In the present semiconductor laser device, the n-type AlGaInP cladding layer 102, the non-doped quantum well active layer 103, the p-type AlGaInP first cladding layer 104 and the p-type GaInP etching stop layer 105 are sequentially laminated on the n-type GaAs substrate 101.

Here, on the p-type GaInP etching stop layer 105, a ridge portion is formed by sequentially laminating the p-type AlGaInP second cladding layer 106, the p-type GaInP cap layer 107 and the p-type GaAs contact layer 108. On both sides of the ridge portion, a stripe-like SiO$_2$ mask (dielectric layer) 701 is formed with a thickness of 0.3 μm and is spaced apart from the ridge portion. The n-type AlInP block layer 109 is formed composing a current/light narrowing structure in a state where the p-type GaAs contact layer 108 in the ridge portion is open. Since a wing portion is not formed, in this case, the stress at the time of bonding tends to concentrate on the ridge portion, but it is possible to avoid such concentration by forming a thick p-type ohmic electrode, reducing a difference in temperature between a heat sink and a chip by heating the chip when the heat sink and the chip are joined, or controlling exactly the temperature of the solder used for joining the heat sink and the chip.

The p-type ohmic electrode 110 is formed on the p-type GaAs contact layer 108 and the n-type AlInP block layer 109 while the n-type ohmic electrode 111 is formed on the n-type GaAs substrate 101.

Figure 10:
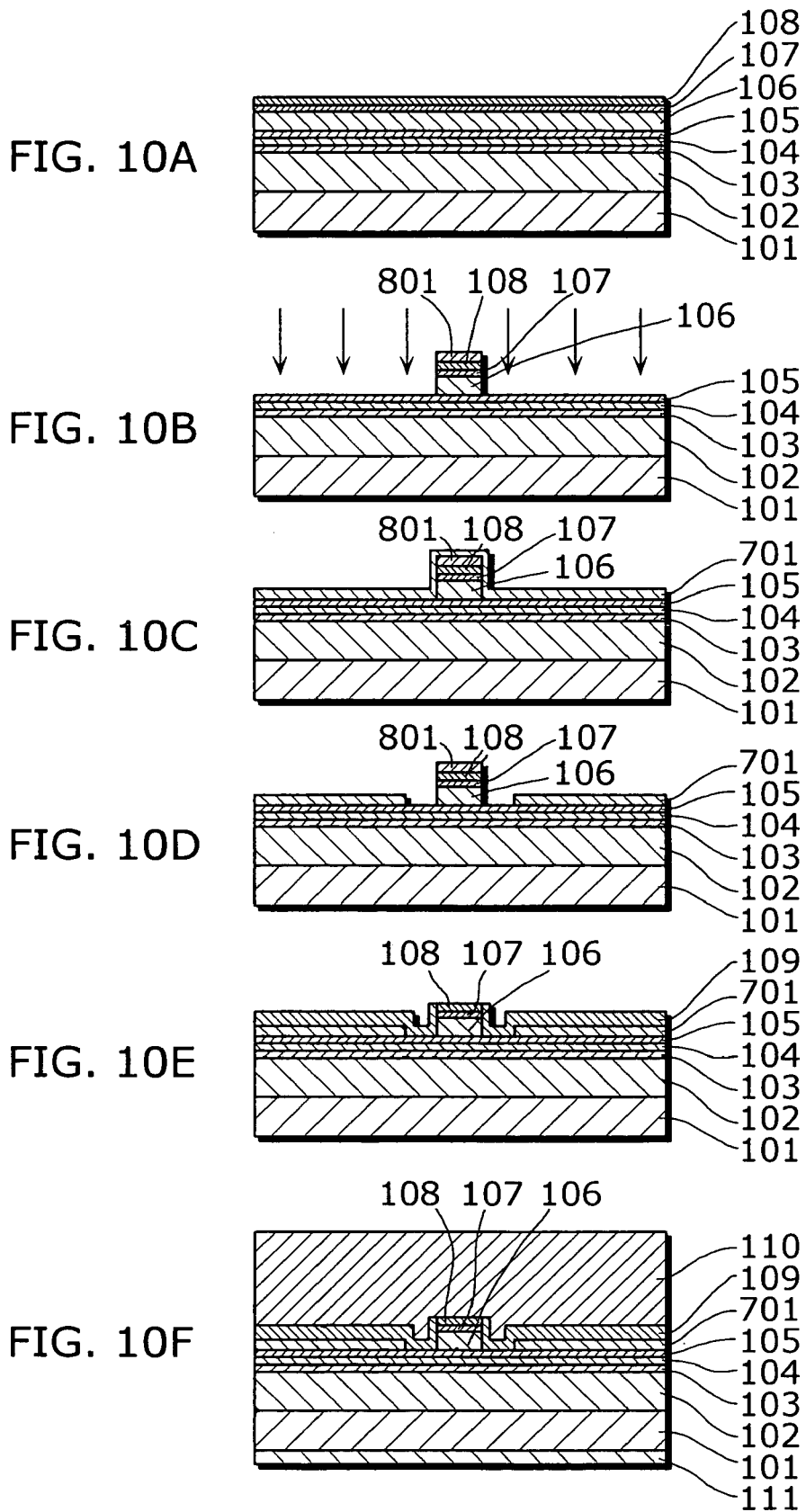
FIG. 10 is a cross-sectional view for explaining the method of manufacturing the semiconductor laser device according to the fourth embodiment.

The following describes the method of manufacturing the semiconductor laser device having the structure as described above, with reference to the cross-sectional view shown in FIG. 10. It should be noted that the same marks are put for the same components as those shown in FIG. 9, and the detailed description for such components is omitted here.

As shown in FIG. 10A, the n-type GaAs substrate 101 is firstly placed in a crystal growth apparatus. The n-type AlGaInP cladding layer 102, the non-doped quantum well active layer 103, the p-type AlGaInP first cladding layer 104, the p-type GaInP etching stop layer 105, the p-type AlGaInP second cladding layer 106, the p-type GAInP cap layer 107 and the p-type GaAs contact layer 108 are sequentially laminated on the n-type GaAs substrate 101 by a first crystal growth.

As shown in FIG. 10B, an SiO$_2$ layer is deposited, until the thickness amounts to 0.3 μm. On the n-type GaAs substrate 101 on which the semiconductor layer is formed as described above, pattern formation is performed onto the layer using the photolithographic technology while an SiO$_2$ mask 801 is formed in stripes on the p-type GaAs contact layer 108. Then, a ridge portion is formed by etching the p-type GaAs contact layer 108, the p-type GaInP cap layer 107 and the p-type AlGaInP second cladding layer 106 so as to form striped trenches, employing the selective etching technique where the SiO$_2$ mask 801 is used as an etching mask, until it reaches the p-type GaInP etching stop layer 105. The etching solution used for the selective etchings respectively performed for the GaInP layer and the GaAs layer is the same as the one used in the first embodiment.

As shown in FIG. 10C, the SiO$_2$ mask (dielectric layer) 701 is deposited, until the thickness amounts to 0.3 μm, on the n-type GaAs substrate 101 on which the semiconductor layer is formed by performing pattern formation, and on the SiO$_2$ mask 801.

As shown in FIG. 10D, the SiO$_2$ mask 701 in the vicinity of the ridge portion is etched by photolithography.

As shown in FIG. 10E, the SiO$_2$ mask 801 on the ridge portion is removed after the n-type AlInP block layer 109 grows, by a second crystal growth, on both sides of the stripe-like SiO$_2$ mask 701, namely, on the SiO$_2$ mask 701 and the p-type GaInP etching stop layer 105 as well as on the mask and on the side surfaces of the p-type GaAs contact layer 108 and the p-type AlGaInP second cladding layer 106. Here, the width of the ridge portion being narrow, the n-type AlInP block layer 109 grows selectively in the region other than the SiO$_2$ mask 801 on the ridge portion. On the SiO$_2$ mask 701, the n-type AlInP block layer 109 grows by poly growth.

As shown in FIG. 10F, the p-type electrode 110 is formed on the p-type GaAs contact layer 108 and the n-type AlInP block layer 109 while the n-type ohmic electrode 111 is formed on the n-type GaAs substrate 101. By adjusting the cavity length to 900–1100 μm based on a cleavage method, a coating film (not shown in the diagram) is formed with 5% reflectivity for the outgoing side and with 95% reflectivity for the reflection side, respectively.

As described above, according to the semiconductor laser device of the present embodiment, the n-type AlInP block layer 109 is formed on the SiO₂ mask 701 in the region other than the vicinity of the ridge portion. Thus, the SiO₂ mask is formed between the n-type AlInP block layer and the p-type AlGaInP first cladding layer. This reduces the amount of capacitance generated as a result of the p-n junction formed between the block layer and the cladding layer. It is therefore possible to realize the semiconductor laser device that has a satisfactory high-speed response characteristic.

According to the semiconductor laser device of the present embodiment, the n-type AlInP block layer 109 is formed in the vicinity of the ridge portion where the temperature gets higher due to the laser oscillation. Thus, as it is possible to allow the heat generated in the device at the oscillation at high temperature and with high power to escape efficiently, the semiconductor laser device that has a satisfactory temperature characteristic can be realized.

An SiO₂ layer is taken as an example of the dielectric layer formed on both sides of the ridge portion, however, the present invention is not limited to this.

Fifth Embodiment

Figure 11:
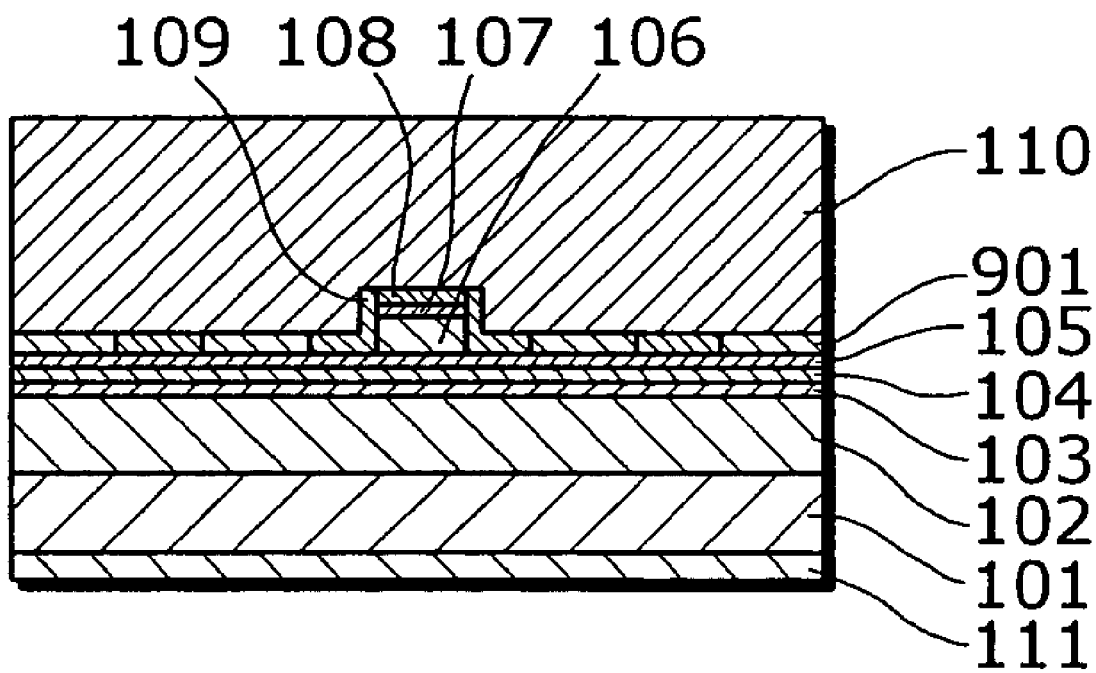
FIG. 11 is a cross-sectional view showing the structure of a semiconductor laser device according to a fifth embodiment.

FIG. 11 is a cross-sectional view of the structure of the semiconductor laser device according to the fifth embodiment. It should be noted that the same marks are used for the same components as those shown in FIG. 9, and the detailed description for such components is omitted.

The semiconductor laser device according to the present embodiment differs from that of the fourth embodiment in that stripes are periodically formed on both sides of the ridge portion using an SiO₂ mask. In the present semiconductor laser device, the n-type AlGaInP cladding layer 102, the non-doped quantum well active layer 103, the p-type AlGaInP first cladding layer 104 and the p-type GaInP etching stop layer 105 are sequentially laminated on the n-type GaAs substrate 101.

On the p-type GaInP etching stop layer 105, a ridge portion is formed by sequentially laminating the p-type AlGaInP second cladding layer 106, the p-type GaInP cap layer 107 and the p-type GaAs contact layer 108. On both sides of the ridge portion, plural stripe-like SiO₂ masks 901, each having a thickness of 0.3 μm, are periodically formed at intervals. The n-type AlInP block layer 109 forms a current/light narrowing structure in a state where the p-type GaAs contact layer 108 in the ridge portion and the SiO₂ mask 901 are open.

The width of the SiO₂ mask 901 and the distance between the SiO₂ masks 901, in this case, are determined considering the selective growth performed for the n-type AlInP block layer 109, the width of the bottom part of the ridge portion and the width of the semiconductor laser device as a whole. For example, in the case where the width of the semiconductor laser device is 200–300 μm and the width of the bottom part of the ridge portion is 2–3 μm, both the width of the SiO₂ mask and the distance between the SiO₂ masks are determined to be 2–3 μm.

The p-type ohmic electrode 110 is formed on the p-type GaAs contact layer 108, the n-type AlInP block layer 109 and the SiO₂ mask 901 while the n-type ohmic electrode 111 is formed on the n-type GaAs substrate 101.

The following describes the method of manufacturing the semiconductor laser device having the structure as described above, with reference to the cross-sectional view shown in FIG. 12. It should be noted that the same marks are used for the same components as those shown in FIG. 11, and the detailed description for such components is omitted here.

As shown in FIG. 12A, the n-type GaAs substrate 101 is firstly placed in a crystal growth apparatus. The n-type AlGaInP cladding layer 102, the non-doped quantum well active layer 103, the p-type AlGaInP first cladding layer 104, the p-type GaInP etching stop layer 105, the p-type AlGaInP second cladding layer 106, the p-type GAInP cap layer 107 and the p-type GaAs contact layer 108 are sequentially laminated on n-type GaAs substrate 101 by a first crystal growth.

As shown in FIG. 12B, an SiO₂ layer is deposited, until the thickness amounts to 0.3 μm. On the n-type GaAs substrate 101 on which the semiconductor layer is formed as described above, pattern formation is performed onto the layer using the photolithographic technology while an SiO₂ mask 1001 is formed in stripes on the p-type GaAs contact layer 108. Then, a ridge portion is formed by etching the p-type GaAs contact layer 108, the p-type GaInP cap layer 107 and the p-type AlGaInP second cladding layer 106 so as to form striped trenches, employing the selective etching technique where the SiO₂ mask 1001 is used as an etching mask, until it reaches the p-type GaInP etching stop layer 105. The etching solution used for the selective etchings respectively performed for the GaInP layer and the GaAs layer is the same as the one used in the fourth embodiment.

As shown in FIG. 12C, the SiO₂ mask 901 is deposited, until it amounts to 0.3 μm, on the n-type GaAs substrate 101 on which the semiconductor layer is formed by performing pattern formation, and the SiO₂ mask 1001.

As shown in FIG. 12D, plural stripe-like SiO₂ masks 901 are formed by etching the SiO₂ mask 901 using photolithographic technology.

As shown in FIG. 12E, the SiO₂ mask 1001 on the ridge portion is removed after the n-type AlInP block layer 109 grows, by a second crystal growth, on the p-type GaInP etching stop layer 105 and on the side surfaces of the p-type GaAs contact layer 108 and the p-type AlGaInP second cladding layer 106. Here, the width of the ridge portion and that of the SiO₂ mask 901 being narrow, the n-type AlInP block layer 109 grows by selective growth in the region other than the SiO₂ mask 1001 on the ridge portion and the SiO₂ mask 901.

As shown in FIG. 12F, the p-type ohmic electrode 110 is formed on the p-type GaAs contact layer 108, the n-type AlInP block layer 109 and the SiO₂ mask 901 while the n-type ohmic electrode 111 is formed on the n-type GaAs substrate 101. By adjusting the cavity length to 900–1100 μm based on a cleavage method, a coating film (not shown in the diagram) is formed with 5% reflectivity for the outgoing side and with 95% reflectivity for the reflection side, respectively.

As described above, according to the semiconductor laser device of the present embodiment, the width of the SiO₂ mask 901 is narrow and the n-type AlInP block layer 109 grows by selective growth in the region other than the SiO₂ mask 901. Thus, as the n-type AlInP block layer 109 does not grow by poly growth on the SiO₂, the semiconductor laser device that prevents the n-type AlInP block layer from coming off can be realized.

According to the semiconductor laser device of the present embodiment, plural SiO₂ masks 901 are formed at intervals on both sides of the ridge portion. Thus, the region which is not covered by the SiO₂ mask gets larger, and as a result, the heat generated in the device at the oscillation at high temperature and with high power is allowed to escape efficiently, for instance. The semiconductor laser device that has a satisfactory temperature characteristic can be therefore realized.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention can be used as a semiconductor laser device, particularly for the disk system, information processing, or a light source for optical communications.

What is claimed is:

1. A ridge-type laser device comprising:
   a semiconductor substrate of a first conductivity type;
   a cladding layer of the first conductivity type formed on the semiconductor substrate of the first conductivity type;
   an active layer formed on the cladding layer of the first conductivity type;
   a cladding layer of a second conductivity type that has a striped ridge portion and striped convex portions that are formed on both sides of the ridge portion, the cladding layer being formed on the active layer;
   a dielectric layer formed only above the cladding layer of the second conductivity type in the convex portion; and
   a block layer of the first conductivity type formed at least between the ridge portion and the convex portion and on side surfaces of the cladding layer of the second conductivity type.

2. The ridge-type laser device according to claim 1, wherein the block layer of the first conductivity type is further formed on the dielectric layer.

3. The ridge-type laser device according to claim 1, wherein the cladding layer of the second conductivity type composes two or more convex portions, and
   the block layer of the first conductivity type is further formed between the two or more convex portions and on the side surfaces of the cladding layer of the second conductivity type.

4. A method for manufacturing a ridge-type laser device, comprising:
   growing a cladding layer of a first conductivity type, an active layer and a cladding layer of a second conductivity type sequentially by deposition on a semiconductor substrate of the first conductivity type;
   forming a ridge portion and convex portions that are formed on both sides of the ridge portion, by etching the cladding layer of the second conductivity type after forming a mask pattern on the cladding layer of the second conductivity type using a dielectric layer;
   removing only the dielectric layer for the ridge portion; and
   forming a block layer at least between the ridge portion and the convex portion and on side surfaces of the cladding layer of the second conductivity type.

5. The method for manufacturing a ridge-type laser device, according to claim 4, wherein the formation of the block layer between the ridge portion and the convex portion is performed by growing the block layer selectively on the cladding layer of the second conductivity type and the dielectric layer.

6. The method for manufacturing a ridge-type laser device, according to claim 4, wherein in the formation of the ridge portion, two or more of the convex portions are formed, and
   the formation of the block layer between the ridge portion and the convex portion is performed by growing the block layer selectively on the cladding layer of the second conductivity type.

7. A ridge-type laser device comprising:
   a semiconductor substrate of a first conductivity type;
   a cladding layer of the first conductivity type formed on the semiconductor substrate of the first conductivity type;
   an active layer formed on the cladding layer of the first conductivity type;
   a cladding layer of a second conductivity type which has a striped ridge portion and is formed on the active layer;
   a contact layer formed only above the cladding layer of the second conductivity type in the ridge portion;
   a block layer of the first conductivity type formed on the cladding layer of the second conductivity type at both sides of the ridge portion; and
   a dielectric layer formed on the cladding layer of the second conductivity type at both sides of the ridge portion so as to be spaced apart from the ridge portion, wherein the block layer of the first conductivity type is further formed on the dielectric layer.

8. The ridge-type laser device according to claim 7, wherein the cladding layer of the second conductivity type further includes a striped convex portion below the dielectric layer.

9. The ridge-type laser device according to claim 8, wherein a lateral surface of the ridge portion is covered with the block layer of the first conductivity type.

10. The ridge-type laser device according to claim 7, wherein a lateral surface of the ridge portion is covered with the block layer of the first conductivity type.

* * * * *